(12) United States Patent
O'Connor et al.

(10) Patent No.: US 9,106,260 B2
(45) Date of Patent: Aug. 11, 2015

(54) PARITY DATA MANAGEMENT FOR A MEMORY ARCHITECTURE

(71) Applicant: ADVANCED MICRO DEVICES, INC., Sunnyvale, CA (US)

(72) Inventors: James M. O'Connor, Austin, TX (US); Vilas K. Sridharan, Brookline, MA (US); Gabriel H. Loh, Bellevue, WA (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 78 days.

(21) Appl. No.: 13/720,504

(22) Filed: Dec. 19, 2012

(65) Prior Publication Data

US 2014/0173378 A1   Jun. 19, 2014

(51) Int. Cl.
 *H03M 13/11* (2006.01)
 *G06F 11/00* (2006.01)
 *H03M 13/53* (2006.01)
 *H03M 13/05* (2006.01)

(52) U.S. Cl.
 CPC ............... *H03M 13/11* (2013.01); *G06F 11/00* (2013.01); *H03M 13/05* (2013.01)

(58) Field of Classification Search
 CPC ..... H03M 13/11; H03M 13/05; H03M 13/09; G06F 11/00; G06F 11/1076; G06F 11/1008; G06F 11/1068; G06F 11/1072; G06F 11/10; H04L 1/0061; H04L 1/0057
 See application file for complete search history.

(56) References Cited

U.S. PATENT DOCUMENTS

| | | | | | |
|---|---|---|---|---|---|
| 4,339,804 | A | * | 7/1982 | Davison et al. | 711/101 |
| 5,455,939 | A | * | 10/1995 | Rankin et al. | 714/6.2 |
| 5,463,643 | A | * | 10/1995 | Gaskins et al. | 714/766 |
| 7,240,275 | B2 | * | 7/2007 | Smith et al. | 714/782 |
| 8,601,346 | B1 | * | 12/2013 | Onufryk et al. | 714/764 |
| 8,661,218 | B1 | * | 2/2014 | Piszczek et al. | 711/167 |
| 2003/0221155 | A1 | * | 11/2003 | Weibel et al. | 714/752 |
| 2006/0143407 | A1 | * | 6/2006 | Humlicek | 711/143 |
| 2006/0156178 | A1 | * | 7/2006 | Lee et al. | 714/758 |
| 2008/0094811 | A1 | * | 4/2008 | Hazelzet | 361/760 |
| 2009/0116839 | A1 | * | 5/2009 | Kikuchi et al. | 398/79 |

(Continued)

FOREIGN PATENT DOCUMENTS

JP     63076194 A  *  4/1988

OTHER PUBLICATIONS

RAID (redundant array of independent disks, originally redundant array of inexpensive disks), http://en.wikipedia.org/wiki/RAID, accessed Dec. 19, 2012.
"IBM Chipkill Memory, Advanced ECC Memory for the IBM Netfinity 7000 M10," http://www.ece.umd.edu/courses/enee759h.S2003/references/chipkill_white_paper.pdf, accessed Dec. 19, 2012.

(Continued)

*Primary Examiner* — April Y Blair
*Assistant Examiner* — Dipakkumar Gandhi
(74) *Attorney, Agent, or Firm* — Park, Vaughan, Fleming & Dowler LLP

(57) ABSTRACT

A processor system as presented herein includes a processor core, cache memory coupled to the processor core, a memory controller coupled to the cache memory, and a system memory component coupled to the memory controller. The system memory component includes a plurality of independent memory channels configured to store data blocks, wherein the memory controller controls the storing of parity bits in at least one of the plurality of independent memory channels. In some implementations, the system memory is realized as a die-stacked memory component.

20 Claims, 3 Drawing Sheets

(56) References Cited

U.S. PATENT DOCUMENTS

| | | | |
|---|---|---|---|
| 2011/0078496 A1* | 3/2011 | Jeddeloh | 714/6.24 |
| 2011/0225465 A1* | 9/2011 | Blackmon et al. | 714/54 |
| 2011/0276763 A1* | 11/2011 | Daly et al. | 711/122 |
| 2012/0203954 A1* | 8/2012 | Sun et al. | 711/103 |

OTHER PUBLICATIONS

Loh, Gabriel H., "3D-Stacked Memory Architectures for Multi-Core Processors," 35th ACM/IEEE International Conference on Computer Architecture, Jun. 2008.

* cited by examiner

US 9,106,260 B2

PARITY DATA MANAGEMENT FOR A MEMORY ARCHITECTURE

TECHNICAL FIELD

Embodiments of the subject matter described herein relate generally to processors. More particularly, embodiments of the subject matter relate to operating techniques that enhance the reliability of system memory utilized by a processor.

BACKGROUND

Computer architectures and related memory systems are well known. Memory systems for server architectures are typically designed to optimize data read and write speed, and usually include error correction and reliability measures in place. System memory, which is implemented as random access memory (RAM), may be realized using dynamic RAM (DRAM) devices, as is well understood. Historically, system memory has included multiple DRAM chips arranged and controlled such that a block of data is distributed across multiple DRAM chips. With such an arrangement, data can be protected in a manner that is similar to that utilized by a redundant array of independent disks (RAID) in a storage context, where independent DRAM channels are used instead of storage disks.

Die-stacked memory architectures have been proposed as an alternative to traditional memory systems that employ distinct DRAM chips arranged in modules, such as dual in-line memory modules (DIMMs). A die-stacked memory utilizes DRAM devices that are physically stacked in a three-dimensional manner. In contrast to a traditional DIMM based memory system that distributes a block of data across multiple DRAM chips, all of the bits for a requested block of data stored in a die-stacked memory architecture may be provided by as few as one die-stacked DRAM device. Consequently, conventional reliability measures that rely on distributed parity bits cannot be utilized in the context of these die-stacked memory arrangements.

BRIEF SUMMARY OF EMBODIMENTS

An embodiment of a memory system as presented herein includes at least one die-stacked memory component having a plurality of stacked memory devices arranged to provide a plurality of independent memory channels and at least one parity channel. The at least one parity channel is utilized to store parity bits for the plurality of independent memory channels.

Also presented herein is an embodiment of a processor system. The processor system includes a processor core, cache memory coupled to the processor core, a memory controller coupled to the cache memory, and a system memory component coupled to the memory controller. The system memory component includes a plurality of independent memory channels configured to store data blocks, wherein the memory controller controls the storing of parity bits in at least one of the plurality of independent memory channels.

An embodiment of a memory system is also presented herein. The memory system includes die-stacked memory having a plurality of stacked memory devices arranged to provide a plurality of independent memory channels to store data and to store parity bits for the stored data, and a memory controller coupled to the die-stacked memory to control write operations that involve the plurality of independent memory channels and, in response to each of the write operations, to update the parity bits.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. It should be appreciated that the various block components shown in the figures may be realized by any number of hardware, software, and/or firmware components configured to perform the specified functions. For example, embodiments of a system or a component may employ various integrated circuit components, e.g., memory elements, logic elements, look-up tables, or the like, which may carry out a variety of functions under the control of one or more microprocessors or other control devices.

The subject matter presented here relates to memory systems and processor systems that utilize memory systems. In certain embodiments, the memory system (or a portion thereof) is implemented as a die-stacked memory, which can be fabricated from a plurality of DRAM dies that are physically arranged in a stacked configuration. The die-stacked memory includes a plurality of independent memory channels provided by multiple DRAM dies. A data protection approach is provided that is particularly suitable for use with a die-stacked memory architecture. In some embodiments, at least one of the plurality of independent channels is used as a parity channel to store parity bits for some or all of the remaining memory channels. In practice, therefore, any given memory channel could be used to store blocks of data and/or to store parity data. Although not required, some embodiments may use at least one of the independent channels as a devoted parity channel. In certain embodiments, the parity bits are striped across different independent memory channels such that a single memory channel holds the parity bits that protect a given set of data that maps to a given address in one or more other different memory channels. Consequently, if any of the independent channels fails, the parity bits stored by the parity channel(s) can be used to recover the data for the failed channel.

Figure 1:
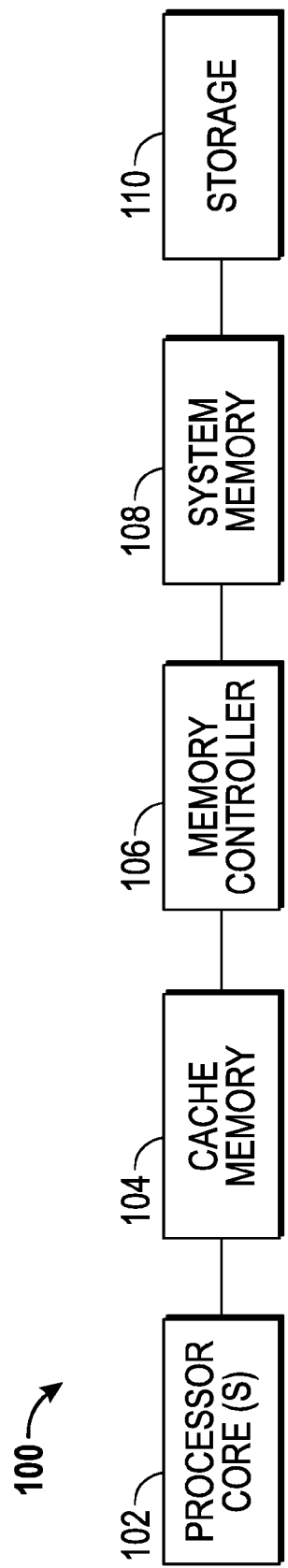
FIG. 1 is a schematic block diagram of an embodiment of a processor system.

Referring now to the drawings, FIG. 1 is a schematic block diagram representation of an embodiment of a processor system 100. FIG. 1 depicts a simplified rendition of the processor system 100, which may include at least one processor core 102, cache memory 104, a memory controller 106, and system memory 108. The processor system 100 may also include or cooperate with at least one data storage component 110. In some embodiments, the processor core 102, the cache memory 104, and the memory controller 106 are realized in a single integrated circuit component (e.g., a microprocessor chip), while the system memory 108 is implemented using one or more distinct integrated circuit components. In certain applications, the cache memory 104, the system memory 108, and the memory controller 106 may cooperate to form a memory system for the host computing system, device, or platform. Moreover, the cache memory 104, the system memory 108, and/or the at least one data storage component 110 could be utilized as computer-readable media that includes computer-executable instructions that, when executed by the processor system 100, carry out some or all of the methods and processes described herein.

The processor core 102 represents the execution core of the processor system 100, which issues demand requests for data. The cache memory 104 is coupled to the processor core 102 to facilitate data access by the processor core 102. FIG. 1 depicts the cache memory 104 in a simplified manner for ease of description and illustration. In some embodiments, however, the cache memory 104 is implemented as a multilevel cache architecture. For example, the cache memory 104 may include a level one (L1) cache memory; a level two (L2) cache memory; and a level three (L3) cache memory, each of which is operatively coupled to the memory controller 106. These cache memories may be coupled to the processor core 102 in a hierarchical manner to form a cache hierarchy, with the L1 cache memory being at the top of the hierarchy and the L3 cache memory being at the bottom. Responsive to demand requests issued by the processor core 102, the cache memory 104 can be searched to determine if the requested data is stored therein. If the data is found in the cache memory 104 (a cache hit), then the cache memory 104 provides the data to the processor core 102.

The memory controller 106 may serve as a control interface for the system memory 108, which may include one or more memory banks. The memory controller 106 may also be coupled to the cache memory 104. Moreover, the memory controller 106 may be coupled to the at least one data storage component 110 via a suitably configured bridge element, and input-output controller, or the like (not shown). More particularly, the memory controller 106 may load cache lines (i.e., blocks of data stored in a cache memory) directly into the cache memory 104 as needed. For example, the memory controller 106 may load a cache line into the cache memory responsive to a demand request by the processor core 102 and a resulting cache miss. The memory controller 106 may also be suitably configured to manage, regulate, and otherwise control the operation of the system memory 108 in the manner described in more detail below, particularly with respect to the various data protection and parity schemes utilized with a die-stacked memory architecture. In this regard, the memory controller 106 may be responsible for: determining where to store data in the system memory 108; maintaining and updating parity bits for the system memory 108; determining where to store parity bits in the system memory 108; handling read and write requests; performing error correction routines; recovering data when a portion of the system memory 108 fails (e.g., when a DRAM device in a die-stacked memory architecture fails); and performing any number of common or conventional operations that are typically performed by memory controllers.

Figure 2:
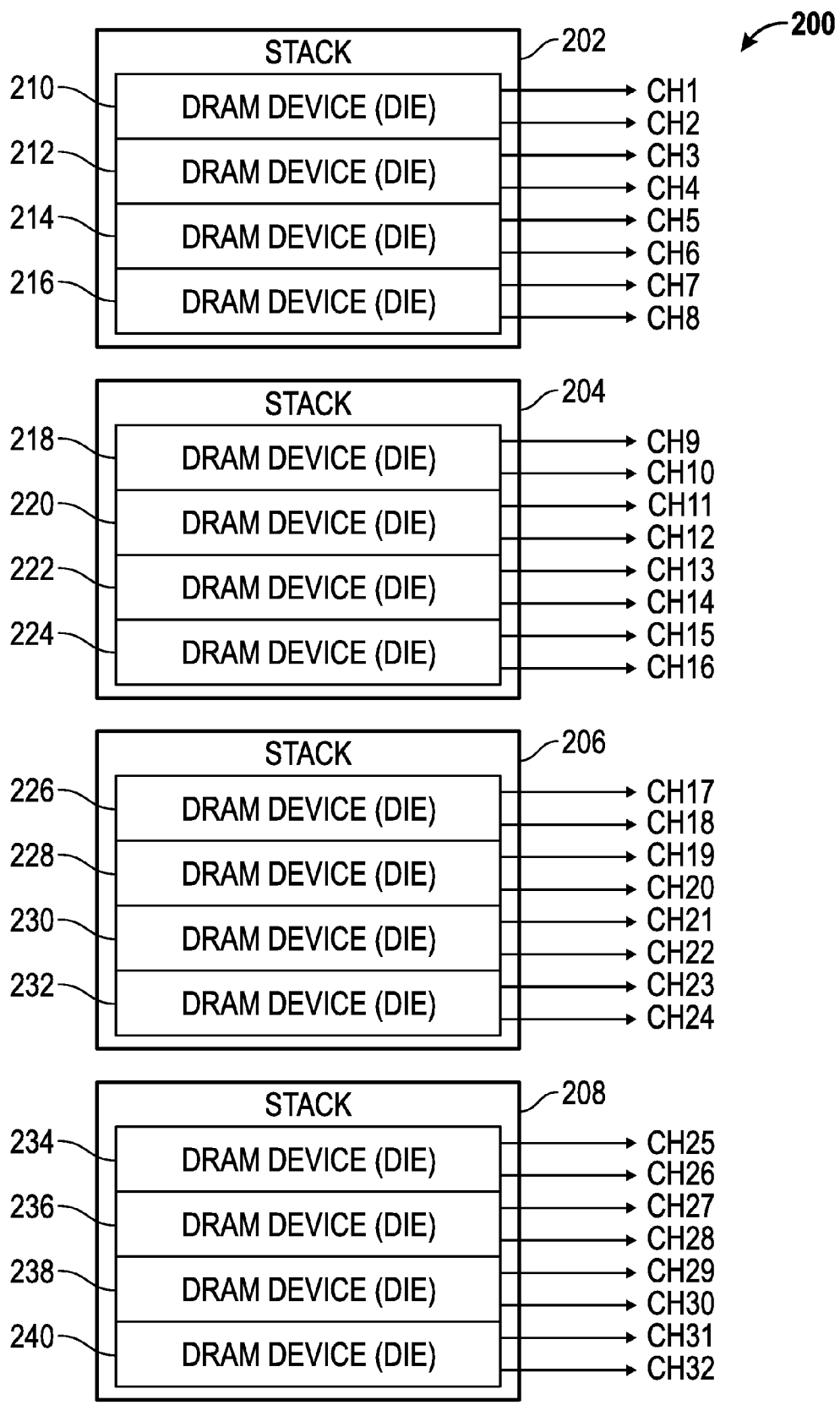
FIG. 2 is a schematic block diagram of an embodiment of a die-stacked memory.

In some embodiments, the system memory 108 includes one or more distinct system memory components that provide a plurality of independent memory channels, wherein one or more of the independent memory channels can also serve as a parity channel to store parity bits for the data stored in the system memory 108. More specifically, the system memory 108 could be implemented as a die-stacked memory having at least one die-stacked memory component, where each die-stacked memory component is realized as a plurality of stacked memory devices (e.g., DRAM dies). In this regard, FIG. 2 is a schematic block diagram representation of an embodiment of a die-stacked memory 200, which is suitable for use as the system memory 108 in the processor system 100.

The illustrated embodiment of the die-stacked memory 200 includes four die-stacked memory components 202, 204, 206, 208. In practice, however, any number (including only one) of distinct die-stacked memory components could be utilized. Each of the die-stacked memory components 202, 204, 206, 208 includes a respective plurality of stacked memory devices. In some embodiments, each of the stacked memory devices is realized as a DRAM device, which is fabricated on a semiconductor die in accordance with conventional semiconductor fabrication techniques. As depicted in FIG. 2, the die-stacked memory component 202 includes four stacked memory devices 210, 212, 214, 216, the die-stacked memory component 204 includes four stacked memory devices 218, 220, 222, 224, the die-stacked memory component 206 includes four stacked memory devices 226, 228, 230, 232, and the die-stacked memory component 208 includes four stacked memory devices 234, 236, 238, 240. It should be appreciated that the number of stacked memory devices in any given die-stacked memory component 202, 204, 206, 208 may be more or less than four, as appropriate to the particular embodiment. Moreover, the number of stacked memory devices in each die-stacked memory component 202, 204, 206, 208 need not be the same. The specific configuration and arrangement shown in FIG. 2 is merely exemplary in nature, and the depicted arrangement is intended to reflect only one of many possible implementations.

The die-stacked memory components 202, 204, 206, 208 are arranged and cooperatively controlled to provide a plurality of independent and distinct N-bit memory channels, wherein one or more of the memory channels may also serve as an N-bit parity channel to store parity bits for the data stored in the die-stacked memory components 202, 204, 206, 208. As used here, N is an integer that represents the defined memory bus, interface, or channel width (i.e., number of bits) utilized by the die-stacked memory 200 and, therefore, the host processor system. For example, and without limitation, N may be 64, 128, or 256 to support the desired data block size. Of course, the specific value of N may vary from one embodiment to another as needed to support the desired application. Moreover, in alternative embodiments, the die-stacked memory 200 could utilize different bit widths for different memory channels if so desired (i.e., the value of N need not be the same across all memory channels).

The parity scheme presented here assumes that the data block size is the same across all memory channels. The block size can be as small as one bit, or it can be arbitrarily large and of any chosen size. In some embodiments, the block size corresponds to a fixed request size on a plurality of identical memory channels. In practice, the request size may correspond to the cache line size of the host system. It should be appreciated that more than one processor cycle may be required to transfer a block of data across a memory channel. For example, if the channel width (N) is 128 bits and the data block size is 256 bits, then more than one cycle is needed to transfer a block. Thus, the bus width for each memory channel need not match the defined block size. Moreover, as mentioned above, the bus widths of all the memory channels need not be identical.

In some embodiments, the die-stacked memory 200 is configured and controlled such that all N bits of any given channel are provided by a single one of the stacked memory devices and such that any block of data will be written to and read from one and only one stacked memory device. Stated another way, blocks of data are not distributed or striped across different stacked memory devices. In some embodiments, a block of data is distributed across more than one stacked memory device. For any such embodiments, each independent memory channel supported by the die-stacked memory 200 is associated with independently accessible memory storage cells and associated circuitry. Thus, from a failure detection and recovery perspective, most if not all of the circuitry and memory cells associated with one channel are not shared with the circuitry and memory cells of another channel (even if they might share the same die). In this way, a failure in the circuitry or memory cells of one memory channel is not likely to impact any other memory channel. Consequently, there is a very high probability that any failure in a memory channel will be limited to corrupting requests in only that memory channel.

The embodiment depicted in FIG. 2 is arranged such that each individual stacked memory device 210-240 is associated with a plurality of channels. More specifically, each stacked memory device in FIG. 2 is associated with two different channels. In alternative embodiments, however, any given stacked memory device 210-240 could be associated with more or less than two different channels. The particular arrangement and configuration may vary from one embodiment to another, and the "two to one" architecture described here relates to certain embodiments that employ sixteen stacked memory devices to support a total of thirty-two channels.

In accordance with the embodiment depicted in FIG. 2, the four die-stacked memory components 202, 204, 206, 208 cooperate to provide a total of thirty-two distinct channels, which correspond to thirty-two independent memory channels (labeled "CH1" to "CH32" in FIG. 2). One or more of these independent memory channels can be used to store parity bits for the data stored in the die-stacked memory 200. In some embodiments, some of the independent memory channels can be utilized as a plurality of parity channels to redundantly store the parity bits for the other independent memory channels. For example, the die-stacked memory 200 could be modified to provide thirty memory channels and two parity channels if so desired. In this regard, the thirty-two channels could be grouped into two sets of sixteen channels, such that each set includes fifteen independent memory channels and one parity channel to store the parity bits for the fifteen memory channels. Such an arrangement increases the capacity overhead (one-sixteenth of the memory is used for parity), but reduces the latency for reconstructing data in the event of a detected error, because data would only need to be read from sixteen channels rather than thirty-two. Of course, other variations and configurations are contemplated by this disclosure.

The numbering and assignment of the independent memory channels shown in FIG. 2 are arbitrary. In practice, parity bits could be saved to any one or more of the die-stacked memory components 202, 204, 206, 208, and to any of the individual stacked memory devices 210-240, subject to the architecture of the stacked memory devices and any designated management and distribution schemes executed by the memory controller. In certain embodiments, the parity bits are striped across the different stacked memory devices 210-240 in a manner that facilitates effective and efficient data recovery when needed. In this regard, consider all of the data at a given address X for each of the stacked memory devices 210-240. The parity bits for the data corresponding to address X are saved in only one of the individual stacked memory devices 210-240. Thus, the parity bits for the data corresponding to another address (e.g., X+1) may be saved in a different one of the individual stacked memory devices 210-240. Assuming that parity bits are not redundantly stored, the illustrated embodiment of the die-stacked memory generates parity bits (corresponding to a given address) for data stored in thirty-one of the independent memory channels and saves the generated parity bits in the remaining independent memory channel. Although the parity bits could be stored at any address in the remaining memory channel, certain embodiments store the parity bits at the same address at which the protected data is stored (for example, the parity bits for the data corresponding to address X are stored at the same address X in the parity channel). Accordingly, the parity information for the data stored in the die-stacked memory may be found in any of the thirty-two independent memory channels (the parity bits are located in a distributed manner based on the data address), however, the parity bits corresponding to any given address are located in only one of the individual stacked memory devices 210-240.

As mentioned previously, each channel depicted in FIG. 2 may represent an N-bit channel that is compatible with an architecture that handles data blocks and memory requests of a designated bit width. In this regard, each memory request (read or write) directed to the memory system corresponds to a respective block of data, and all of the requested bits of data are provided by a single channel. In other words, all bits of data for a given memory request will be written to or provided by one or more independent memory banks within the plurality of stacked memory devices 210-240.

In some embodiments, the memory system may be suitably configured with at least one independent and unprotected memory channel, wherein the data stored in association with the unprotected channel(s) is not protected by the parity bits stored in association with the protected channels. For example, one of the four die-stacked memory components 202, 204, 206, 208 could be reserved for storage of data that is deemed unimportant, is of low priority, is less sensitive to errors, or the like. As another example, any number of the individual stacked memory devices 210-240 could be designated as "unprotected" devices that fall outside the scope of the parity scheme that involves the other stacked memory devices 210-240. Such partitioning of protected and unprotected portions of the memory space could be configurable by software (e.g., setting address range registers to specify the portion of the memory that is protected and/or unprotected). Accordingly, the memory controller 108 can be suitably configured such that it does not update the parity bits when it handles write operations that involve an independent and unprotected memory channel. Thus, the parity bits will only be updated in response to write operations that involve the protected memory channels.

Alternatively (or additionally), protected and unprotected portions of the memory system could be defined using specified address ranges. For example, a protected portion of the die-stacked memory 200 may be associated with or defined by a first designated address range (or a first plurality of address ranges), and an unprotected portion of the die-stacked memory 200 may be associated with or defined by a second designated address range (or a second plurality of address ranges). In this context, a single independent memory channel could be partitioned such that it has both a protected portion and an unprotected portion, as determined by the specified address ranges.

In some embodiments, the stacked memory devices 210-240 in the die-stacked memory 200 are realized as DRAM devices. Each DRAM device in the die-stacked memory 200 communicates with the memory controller 106 (see FIG. 1) across at least one interface. For the illustrated embodiment, each of the thirty-two independent channels represents one such interface. Accordingly, the arrows depicted in FIG. 2 may represent the interfaces leading to the memory controller 106.

In practice, the data in the die-stacked memory 200 can be addressed by row, bank, and column locations (in accordance with well-established principles and techniques). Traditional memory controllers compute a channel number and a Row, Bank, and Column (RBC) address from a physical address to accommodate data striping across a plurality of channels. In contrast to the traditional addressing approach, the memory controller 106 (see FIG. 1) stores a given block of data in one (and only one) of the stacked memory devices 210-240, uses independent memory channels to store blocks of data, and uses at least one independent memory channel as a parity channel to store parity data. Accordingly, the traditional addressing scheme may need to be modified or enhanced to efficiently handle the parity data, store the parity bits, and the like. Generally, the addressing scheme for the die-stacked memory 200 is suitably designed to respond to a given physical address to provide the location of the requested data and to provide the location of the associated parity bits. The particular addressing scheme employed by the memory controller 106 may vary from one embodiment to another, and the specifics of such addressing schemes need not be described in detail here.

The memory system described here may also incorporate an appropriate error detection and/or correction scheme. For example, error-correcting code (ECC) bits may be utilized to detect errors in response to memory read operations. Alternatively or additionally, other technologies could be employed to detect or correct errors including, without limitation: checksums; cyclic redundancy codes (CRCs); or a combination thereof. In accordance with some embodiments, the die-stacked memory component stores a plurality of data blocks, and each of the data blocks includes a respective ECC and/or a respective error detection code. These techniques are well known to those of ordinary skill in the art, and, therefore, the specifics of these techniques will not be described in detail here. For the sake of simplicity and clarity, and although any suitable technique can be employed, the following description refers to ECC bits and a corresponding ECC scheme in connection with the operation of the memory system.

Figure 3:
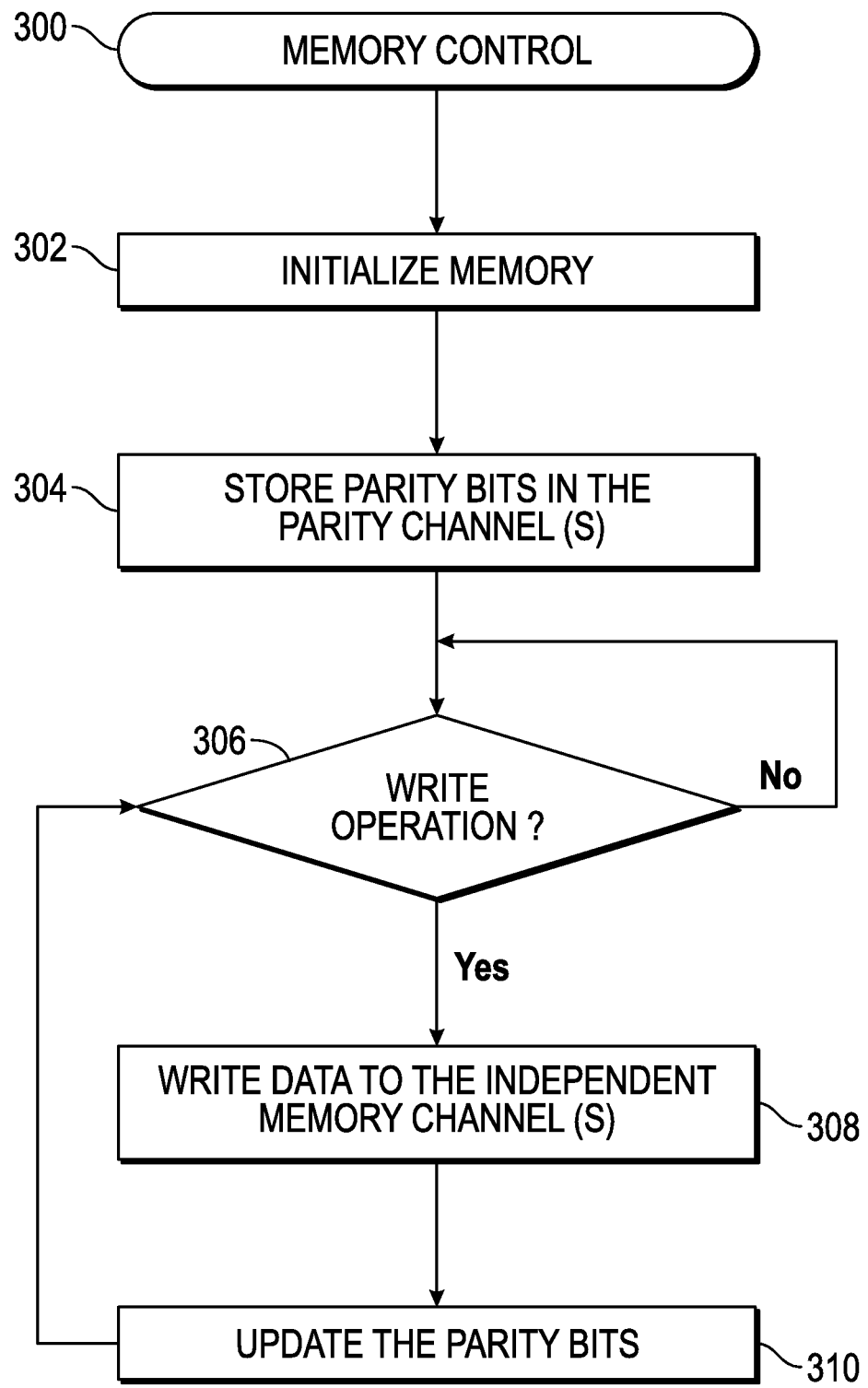
FIG. 3 is a flow chart that illustrates an embodiment of a method of operating a memory system having a plurality of independent memory channels.

The memory controller 106 (see FIG. 1) is suitably configured to manage data access associated with the memory system. In particular, the memory controller 106 may be responsible for updating parity bits in response to write operations. In this regard, FIG. 3 is a flow chart that illustrates an embodiment of a memory control process 300, which may be performed during the operation of a memory system having a plurality of independent memory channels (as described above). The various tasks and functions performed in connection with the process 300 may be performed by software, hardware, firmware, or any combination thereof. In certain embodiments, the process 300 may be performed by a processor or a processing architecture executing computer-readable instructions that are provided on a tangible and non-transitory computer readable medium. For illustrative purposes, the following description of the process 300 may refer to elements mentioned above in connection with FIG. 1 and FIG. 2. It should be appreciated that an embodiment of the process 300 may include any number of additional or alternative tasks, the tasks shown in FIG. 3 need not be performed in the illustrated order, and the process 300 may be incorporated into a more comprehensive procedure or process having additional functionality not described in detail herein. Moreover, one or more of the tasks shown in FIG. 3 could be omitted from an embodiment of the process 300 as long as the intended overall functionality remains intact.

The process 300 assumes that a die-stacked memory architecture (of the type described above) has already been designed, configured, and deployed in the host computing platform. The process 300 may begin by initializing the memory system (block 302). Initialization may occur, for example, when the host computing system is powered on, reset, or the like. In accordance with some embodiments, the initializing is carried out by zeroing out all of the memory locations, including the parity bits, to establish an initial and valid state. In alternative embodiments, the initializing is carried out by reading the current memory locations and calculating the parity bits based on the existing data stored in the independent memory channels. The parity bits can be generated in accordance with any number of well-established techniques. For example, the parity bits to be stored at a given RBC address of a parity channel may be calculated as the "exclusive or" (XOR) of the data stored at the same RBC address in each of the other independent memory channels. In the context of the example depicted in FIG. 2, the parity bits stored in association with a particular RBC address of one independent memory channel (i.e., the channel to be used as the parity channel) are calculated by XORing thirty-one inputs corresponding to the same RBC address, where the thirty-one inputs are respectively provided by the thirty-one other independent memory channels.

After the parity bits are generated, the process 300 stores the parity bits in the appropriate parity channel (block 304). For the illustrated example, block 304 represents the saving of the initial parity bits. These initial parity bits are updated in an ongoing manner in response to write operations that involve any of the independent memory channels.

In some embodiments, the parity information is stored across a plurality of different memory channels. For example, the process 300 could store data for row 0 in channels 0-30, and store the respective parity bits in channel 31. For row 1, data is stored in channels 0-29 and 31, and the respective parity bits are stored in channel 30. For row 2, the data is stored in channels 0-28, 30, and 31, and the respective parity bits are stored in channel 29. In this manner, the parity is stored in a different channel for each respective row. Other ways of "rotating" the parity information across the memory channels are also contemplated (e.g., rotating on a block basis rather than by row: the parity for row 0, block 0 is in channel 31, the parity for row 0, block 1, is in channel 30, the parity for row 0, block 2 is in channel 29, etc.). In accordance with other embodiments, all of the parity bits for the stored data are stored in association with one or more devoted parity channels (in other words, no parity information is saved in any of the independent memory channels).

This description assumes that the process 300 determines or otherwise detects when a requested write operation involves one or more protected memory channels (the "Yes" branch of query block 306). This decision may be facilitated by way of a suitable addressing scheme where a certain range of addresses correspond to protected memory, while another range of addresses correspond to unprotected memory. If all of the memory space is protected, then the query block 306 may instead simply check for the occurrence of a write request. In response to such a write operation, the process 300 writes the requested data to the appropriate independent memory channel or channels (block 308) and updates the associated parity bits (block 310) as needed. In certain embodiments, the memory controller 106 (see FIG. 1) controls the writing of the data and the updating of the parity bits.

In accordance with some embodiments, the process 300 updates the parity bits by updating and saving parity data stored in the stacked memory device(s) that have been utilized as parity channel(s). For such embodiments, whenever a dirty cache line is evicted back to the system memory 108, the original data in the die-stacked memory 200 is read and XORed with the new data to form a parity update. The parity update identifies which parity bits flip in response to the new data. The dirty data is then written to the designated die-stacked memory device. Thereafter, the parity update is sent to the memory controller 106 for purposes of updating the parity data. The existing parity data is read and the parity update is XORed with the existing parity data to obtain the updated parity bits. The updated parity bits can then be written back to the appropriate die-stacked memory device. In practice, this approach represents two read-modify-write cycles on the DRAM devices.

In accordance with other embodiments, the process 300 updates the parity bits by updating and saving parity data stored in the cache memory 104 (see FIG. 1). This approach may improve performance and speed relative to the previously described approach. For this approach, the parity bits are updated in the cache hierarchy in response to a write operation that involves any of the protected memory channels. Thus, whenever a line needs to have its cache coherence state moved to a modified state, the memory controller saves an original (clean) copy of the identified data in the cache memory (i.e., the cache data is kept in the cache in a new "original" state). This original clean copy of the cached data is saved in association with the modified dirty copy of the data. Accordingly, the cache memory will include a cached clean copy of the data of interest and a cached dirty copy of the data of interest. The clean cache line always maps to the same set as the dirty cache line, and will effectively remain associated with the modified data as the modified data is moved around in the cache hierarchy. In this regard, the memory controller moves the cached clean copy of the data and the cached dirty copy of the data together as an associated unit throughout the cache memory. Alternatively, the "original" cache lines could be moved out to the last level of the cache hierarchy, where they reside until their corresponding "modified" data is evicted from the cache. Thus, when the modified dirty copy of the data is written back to the system memory component (i.e., written to a die-stacked memory device), both the original data and the new data remain available in the cache to compute the parity update. This enables the memory controller to update the parity bits using the cached clean copy of the data and the cached dirty copy of the data. In comparison to the approach described above, this cache-based approach eliminates at least one of the read-modify-write cycles on the write data. In practice, one read-modify-write cycle is still performed to update the parity bits (or the updated parity bits could be retained in the cache if so desired).

FIG. 3 depicts the block 310 leading back to the query block 306. This loop represents the potentially ongoing nature of the process 300, wherein the parity bits are updated in response to any write operation that involves one or more of the independent memory channels in the die-stacked memory architecture. As mentioned above, the memory architecture may include portions that are unprotected by the parity scheme and, if so, the parity bits remain unchanged in response to write operations that involve unprotected data.

The parity data saved in the die-stacked memory facilitates the recovery of data in the event of a failure or unrecoverable error associated with a die-stacked memory device. More specifically, when an uncorrectable error (which may be detected using an ECC scheme) occurs in response to a given memory request for one of the data channels, the original data in the corrupted channel can be recovered by reading the corresponding data in the remaining (non-corrupt) data channels, which include the required parity data. The retrieved data and parity data can then be XORed together to recover the original data. In accordance with some embodiments, the recovery operation is performed on every access that detects an uncorrectable error. Another possible implementation triggers a rebuilding or recovery operation when more than a threshold number of errors are detected. The rebuilding operation reads the data from all data locations (while rebuilding corrupted data from a failed memory channel, using the parity data if needed) and writes back the data (without parity bits) into the remaining memory channels. Thus, the memory controller may perform a data recovery operation that replaces at least some of the parity bits with recovered error-free data. In other words, the channel that was previously used to store the parity bits replaces the failed memory channel, which can be removed from service. A variation of this rebuilding scheme may implement the rebuilding effort on a smaller scale, e.g., one bank of memory at a time. As an extension of this rebuilding scheme, if multiple parity channels are available, then the data from the failed memory channel can be moved to one of the parity channels, while retaining parity bits in the remaining parity channel(s).

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:
1. A memory system comprising:
   at least one die-stacked memory component comprising a plurality of stacked memory devices arranged to provide a plurality of independent memory channels and at least one parity channel;

wherein the at least one parity channel is utilized to store parity bits for the plurality of independent memory channels in a corresponding portion of at least one memory device in the plurality of stacked memory devices; and wherein the die-stacked memory component includes at least one independent and unprotected memory channel for which parity bits are not updated in response to write operations for the at least one independent and unprotected memory channel.

2. The memory system of claim 1, wherein the at least one parity channel comprises a plurality of parity channels to redundantly store the parity bits for the plurality of independent memory channels in corresponding portions of memory devices in the plurality of stacked memory devices.

3. The memory system of claim 1, wherein the at least one parity channel comprises a plurality of parity channels to store the parity bits for the plurality of independent memory channels in corresponding portions of memory devices in the plurality of stacked memory devices.

4. The memory system of claim 1, further comprising a memory controller for the at least one die-stacked memory component, wherein the memory controller updates the parity bits associated with the at least one parity channel in response to a write operation that involves any of the plurality of independent memory channels.

5. The memory system of claim 1, wherein the at least one die-stacked memory component comprises a plurality of distinct die-stacked memory components.

6. The memory system of claim 1, wherein each of the plurality of independent memory channels and the at least one parity channel is associated with only one of the stacked memory devices.

7. The memory system of claim 1, wherein:
the at least one die-stacked memory component stores a plurality of data blocks; and
each of the plurality of data blocks comprises a respective error-correcting code.

8. The memory system of claim 1, wherein:
the at least one die-stacked memory component stores a plurality of data blocks; and
each of the plurality of data blocks comprises a respective error detection code.

9. The memory system of claim 1, wherein the plurality of stacked memory devices in the at least one die-stacked memory component are arranged in a stack, the stack having a memory device located at a bottom of the stack and at least one other memory device stacked atop the memory device.

10. A processor system comprising:
a processor core;
cache memory coupled to the processor core;
a memory controller coupled to the cache memory; and
a system memory component coupled to the memory controller, the system memory component comprising at least one die-stacked memory component having a plurality of stacked memory devices arranged to provide a plurality of independent memory channels configured to store data blocks, wherein the memory controller controls storing parity bits in at least one of the plurality of independent memory channels, which comprises storing the parity bits in a corresponding portion of at least one memory device in the plurality of stacked memory devices, and wherein the die-stacked memory component comprises at least one independent and unprotected memory channel, wherein the memory controller controls write operations for the at least one independent and unprotected memory channel and the memory controller does not update parity bits in response to write operations for the at least one independent and unprotected memory channel.

11. The processor system of claim 10, wherein the system memory component comprises a plurality of die-stacked memory components, each having a plurality of stacked memory devices.

12. The processor system of claim 10, wherein the memory controller updates parity bits stored in the system memory component in response to a write operation that involves any of the plurality of independent memory channels.

13. The processor system of claim 10, wherein the memory controller updates parity bits stored in the cache memory in response to a write operation that involves any of the plurality of independent memory channels.

14. The processor system of claim 10, wherein:
in response to a write operation for identified data that involves any of the plurality of independent memory channels, the memory controller saves an original clean copy of the identified data in the cache memory in association with a modified dirty copy of the identified data, resulting in a cached clean copy of identified data and a cached dirty copy of identified data; and
when the modified dirty copy of the identified data is written back to the system memory component, the memory controller updates the parity bits using the cached clean copy of identified data and the cached dirty copy of identified data.

15. The processor system of claim 14, wherein the memory controller moves the cached clean copy of identified data and the cached dirty copy of identified data together as an associated unit throughout the cache memory.

16. A memory system comprising:
die-stacked memory comprising a plurality of stacked memory devices arranged to provide a plurality of independent memory channels to store data and to store parity bits for the stored data;
a memory controller coupled to the die-stacked memory to control write operations that involve the plurality of independent memory channels and, in response to each of the write operations, to update the parity bits, wherein updating the parity bits comprises storing the parity bits in a corresponding portion of at least one memory device in the plurality of stacked memory devices; and
at least one independent and unprotected memory channel coupled to the memory controller, wherein the memory controller controls write operations for the at least one independent and unprotected memory channel and the memory controller does not update parity bits in response to write operations for the at least one independent and unprotected memory channel.

17. The memory system of claim 16, wherein, when an error is detected in a corrupted one of the plurality of independent memory channels, the memory controller performs a data recovery operation that utilizes the parity bits and data associated with non-corrupt channels of the plurality of independent memory channels.

18. The memory system of claim 16, wherein:
when more than a threshold number of errors are detected in a corrupted one of the plurality of independent memory channels, the memory controller performs a data recovery operation to recover error-free data;
the memory controller replaces at least some of the parity bits with the error-free data; and
the memory controller removes the corrupted one of the plurality of independent memory channels from service.

19. The memory system of claim 16, further comprising cache memory coupled to the memory controller, wherein the memory controller updates the parity bits by updating parity data stored in the cache memory.

20. The memory system of claim 16, wherein:
- the die-stacked memory comprises an unprotected portion associated with a designated address range;
- the memory controller controls write operations that involve the unprotected portion; and
- the memory controller does not update parity bits in response to write operations that involve the unprotected portion.

* * * * *